United States Patent [19]

Yamamoto et al.

[11] Patent Number: 5,318,633
[45] Date of Patent: Jun. 7, 1994

[54] HEAT TREATING APPARATUS

[75] Inventors: Akihito Yamamoto; Naohiko Yasuhisa; Noriyoshi Mashimo, all of Tokyo; Masaharu Abe; Shingo Watanabe, both of Fuchu Tokyo, all of Japan

[73] Assignees: Tokyo Electron Sagami Limited, Kanagawa; Kabushiki Kaisha Toshiba, Kawasaki, both of Japan

[21] Appl. No.: 846,948

[22] Filed: Mar. 6, 1992

[30] Foreign Application Priority Data

Mar. 7, 1991 [JP] Japan .................. 3-104898
Mar. 7, 1991 [JP] Japan .................. 3-104899

[51] Int. Cl.$^5$ .................................................. C23C 16/00
[52] U.S. Cl. ....................................... 118/725; 118/50; 118/724; 118/728; 118/733
[58] Field of Search ................ 118/724, 725, 728, 733

[56] References Cited

U.S. PATENT DOCUMENTS

| | | | |
|---|---|---|---|
| 4,253,417 | 3/1981 | Valentijn | 118/724 |
| 4,745,088 | 5/1988 | Inoue et al. | 118/730 |
| 4,989,540 | 2/1991 | Fuse | 118/719 |
| 5,029,554 | 7/1991 | Miyashita et al. | 118/724 |

Primary Examiner—Anthony McFarlane
Attorney, Agent, or Firm—Oblon, Spivak, McClelland, Maier & Neustadt

[57] ABSTRACT

A heat treating apparatus comprises a reaction tube for receiving a plurality of articles to be treated and a heating unit surrounding at least part of the reaction tube. The reaction tube comprises a first structural section, at least part of which is surrounded by the heating unit and a second structural section, at least part of which extends from the heating unit. The first structural section is made of material having thermal resistivity and thermal conductivity higher than the second structural section.

24 Claims, 4 Drawing Sheets

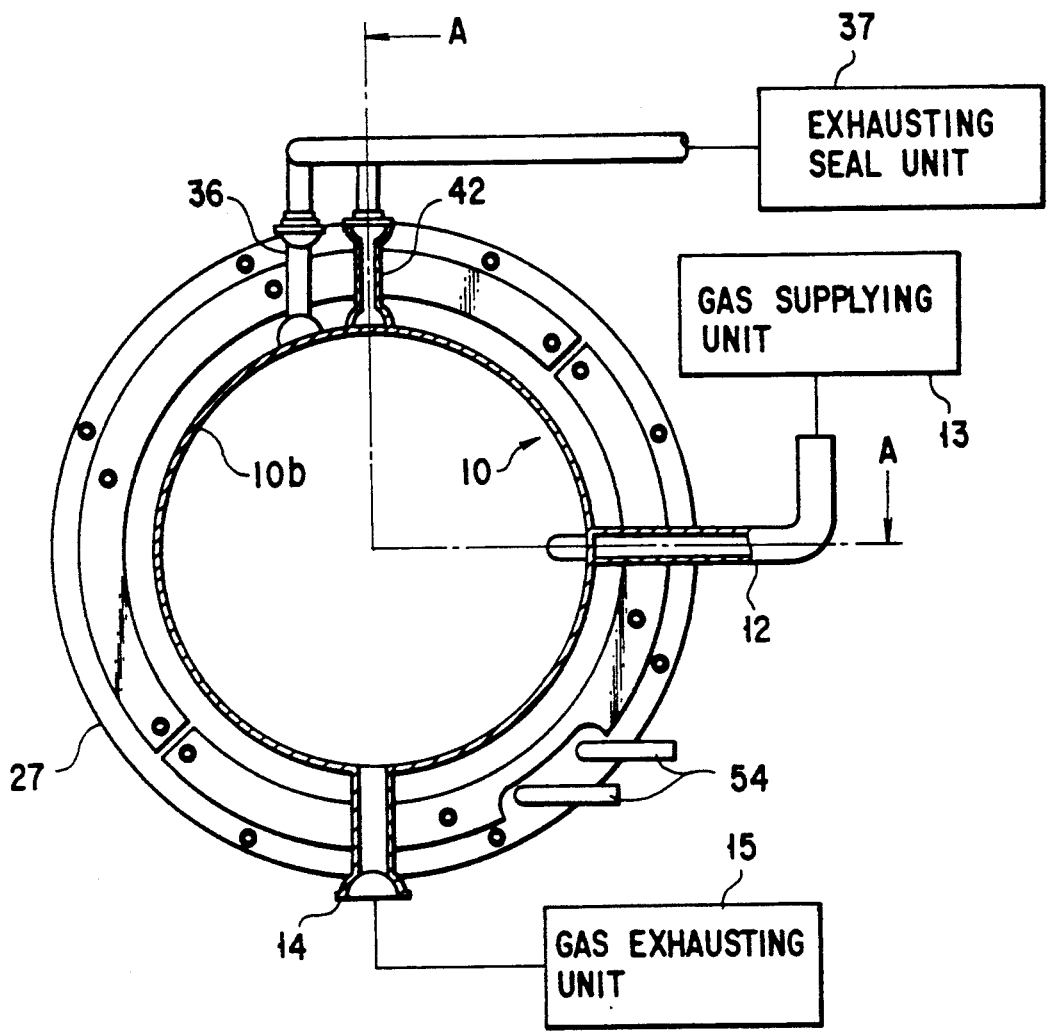
F I G. 2
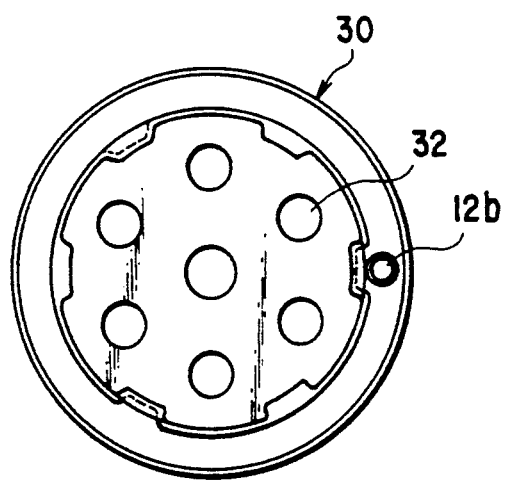
F I G. 3

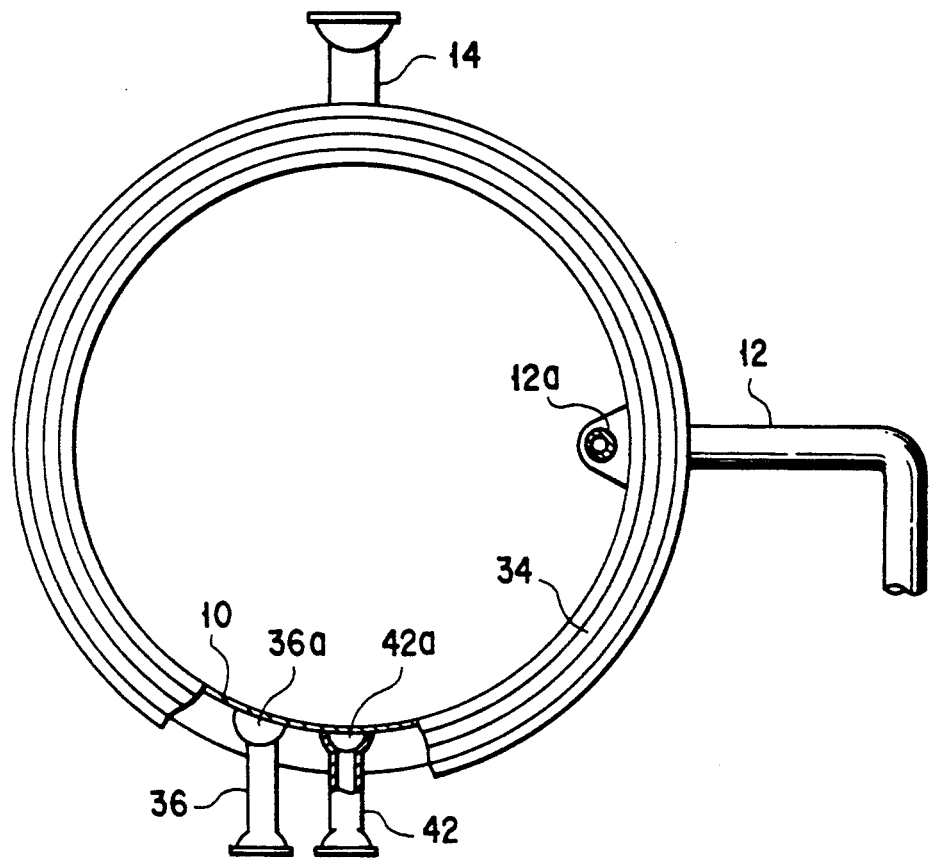
F I G. 4

HEAT TREATING APPARATUS

BACKGROUND OF THE INVENTION

1. Field of the Invention

This invention relates to a heat treating apparatus and more particularly to the improvement of a heat treatment apparatus in which process gas is introduced into a reaction tube, with the reaction tube receiving articles to be heat-treated therein.

2. Description of the Related Art

In the conventional manufacturing process for semiconductor wafers a heat treating apparatus is used in which articles such as semiconductor wafers to be treated are placed in a reaction tube and are heat-treated by means of a CVD process, oxidation and diffusion.

The reaction tube of the heat treating apparatus is made of quartz ($SiO_2$) and formed integrally. A gas introducing pipe and a gas exhausting pipe are provided at the lower portion of the reaction tube. The gas introducing pipe is adapted to cause the exterior of the reaction tube to communicate with the interior thereof. The forward end of the gas introducing pipe extends to the upper position of the interior of the reaction tube.

The gas exhausting pipe projects from the lower position of the reaction pipe.

On a boat provided in the gas exhausting pipe is disposed semiconductor wafers piled up at predetermined intervals. The boat carrying the semiconductor wafers is provided on a warming tubular member (heat holding member) which is raised and lowered by means of a lifting mechanism so that the semiconductor wafers are received in the reaction tube and are taken out therefrom.

When the warming tubular member is raised by means of the lifting mechanism and the semiconductor wafers are fully received in the reaction tube, the reaction tube is completely closed.

Heating means consisting of a heat generator and a heat insulating element is provided in the external region of the reaction tube. The heat generator is attached to the inner peripheral wall of the heat insulating element.

Process gas is introduced from the gas introducing pipe into the reaction tube, and the interior of the reaction tube is heated by means of the heat generator to a predetermined temperature (1,200° C., for example). The semiconductor wafers are heat-treated due to the chemical reaction of the process gas which is being heated.

The reaction tube of this conventional heat treating apparatus is made of $SiO_2$ from which few impurities are discharged during the heat treatment.

However, the reaction tube made of $SiO_2$ encounters the problem in that it is likely to be distorted when it is heated at a high temperature (about 1,200° C., for example) for a long time. In place of $SiO_2$, silicon carbide (SiC) which has a higher thermal resistivity or, in other words, is resistant to the effects of heat, and is thus little distorted at a high temperature might be used for manufacturing a reaction tube in order to suppress the thermal distortion of the reaction tube.

Since, however, the machinability of SiC is poor, it is difficult to manufacture relatively complicated parts of a reaction tube, such as a gas introducing pipe and a gas exhausting pipe, with SiC. Further, the thermal conductivity of SiC is more than ten times larger than that of $SiO_2$. Thus, when the entire reaction tube is made of SiC, a large amount heat is radiated from the lower region of the reaction tube which is not covered with a heat insulator. The portion in which semiconductors are loaded is affected by the heat radiation and the uniform thermal distribution in the region is disturbed.

In the conventional heat treatment process, a reacting substance is likely to become attached to the gas introducing pipe. In order to perform the heat treatment in a good condition, therefore, the gas introducing pipe must be washed and the attached reacting substance must be removed therefrom. The gas introducing pipe in the reaction pipe must be changed according to the kind of heat treatment process which is selected from various kinds of heat treatment processes. Since, however, the conventional gas introducing pipe is integrally formed with the reaction tube, the tube cannot be washed or changed easily.

SUMMARY OF THE INVENTION

The first object of this invention is to provide a heat treating apparatus having a reaction tube which is subjected to little thermal distortion at a high temperature so that the region for receiving articles to be heat-treated is uniformly heated and which is prevented from the entrance of impurities.

The second object of this invention is to provide a heat treating apparatus having a reaction tube which can be machined relatively easily.

The third object of this invention is to provide a heat treating apparatus in which a gas introducing pipe for introducing gas into a reaction tube can be washed easily to remove an attached chemical substance from the gas introducing pipe and parts of the gas introducing pipe which are disposed in the reaction tube can be changed to a required one.

The first and second objects are attained by a heat treating apparatus which comprises a reaction tube for receiving a plurality of articles to be treated and heating means surrounding at least part of the reaction tube, the reaction tube comprising a first structural section and a second structural section at least part of which projects from the heating means, with the first structural member having thermal resistivity and thermal conductivity higher than the second structural member.

The third object of this invention is attained by a heat treating apparatus which comprises a reaction tube for receiving a plurality of articles to be treated, heating means surrounding the reaction tube and gas introducing means for supplying process gas for heat treatment into the reaction tube, the gas introducing means comprising a penetrating portion having a forward end portion passing through the lower portion of the reaction tube and an elongated portion detachably attached to the forward end portion of the penetrating portion and extending to the upper portion of the reaction tube.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a cross-sectional view of the heat treatment apparatus, taken along line B—B in FIG. 1;

FIG. 3 is a plan view of a buffer plate of the heat treatment apparatus shown in FIG. 1;

FIG. 4 is a plan view of the second structural member of the reaction tube of the heat treating apparatus shown in FIG. 1, with a portion broken.

DETAILED DESCRIPTION OF THE PREFERRED EMBODIMENTS

This invention will be explained in detail by way of the preferred embodiments with reference to the accompanying drawings.

FIGS. 1 to 4 show a vertical heat treating apparatus according to one embodiment of this invention, which is used for diffusion-treating semiconductor wafers.

Figure 1:
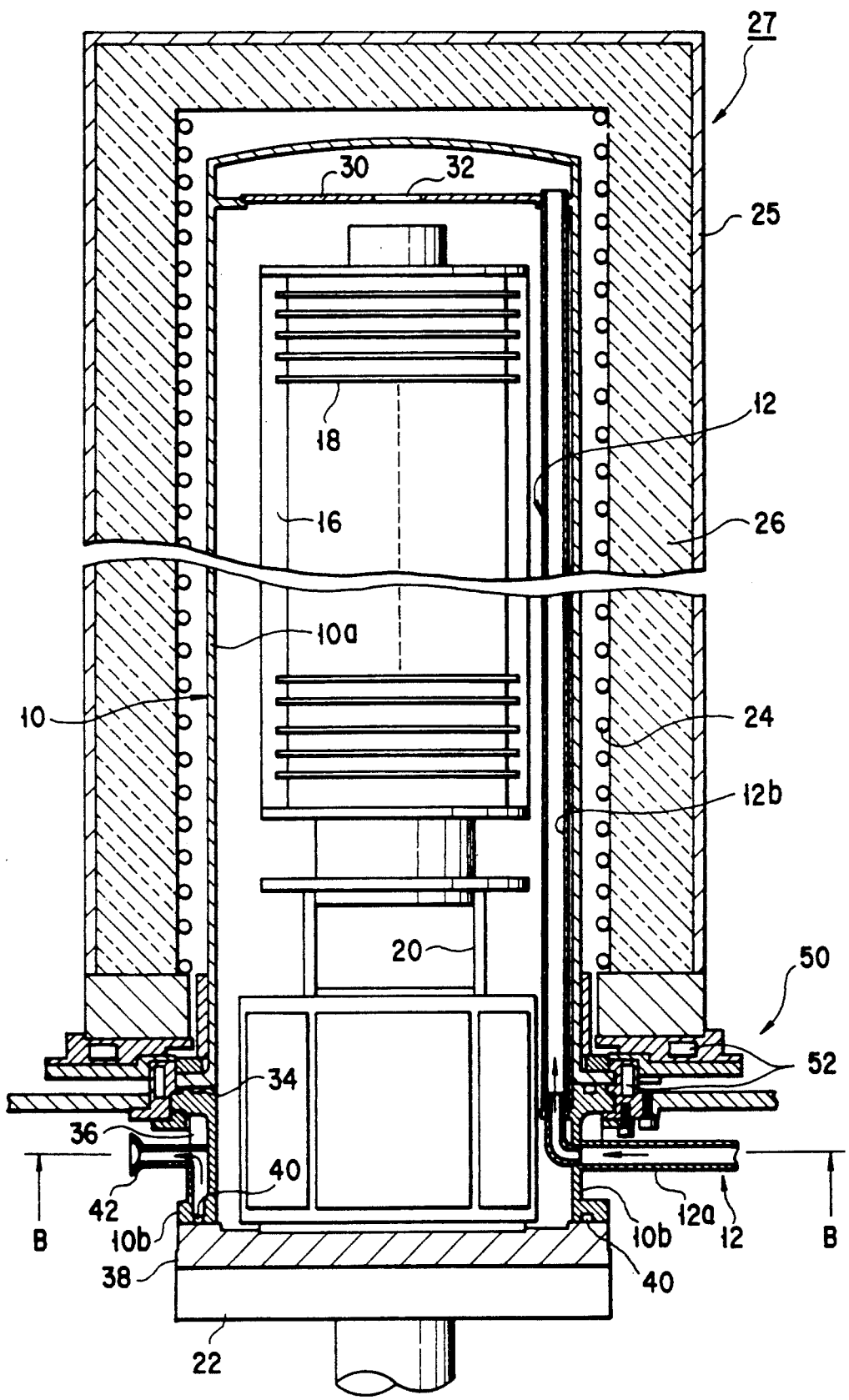
FIG. 1 is a cross-sectional view of an embodiment of the heat treating apparatus according to this invention, taken along line A—A in FIG. 2.

As shown in FIG. 1 and 2, the vertical heat treating apparatus has a reaction tube 10 for receiving semiconductor wafers and heat-treating them. The reaction tube 10 is made of quartz ($SiO_2$) and has an integral structure. A gas introducing pipe 12 and a gas exhausting pipe 14 are provided on the lower end portion of the reaction tube 10.

The gas introducing pipe 12 is formed so as to cause the outer portion of the reaction tube 10 to communicate with the inner portion thereof, and the front end portion of the ga introducing pipe 12 extends to the upper portion of the reaction tube 10. To the gas introducing pipe 12 is connected a gas supplying unit 13 provided externally of the reaction tube 10. The gas exhausting pipe 14 projects from the lower portion of the reaction tube 10 and is connected to a gas exhausting unit 15 provided externally of the reaction tube 10.

A predetermined number of semiconductor wafers 18 are received in the reaction tube 10 so as to be vertically arranged at predetermined intervals. A wafer boat 16 on which the semiconductor wafers 18 are disposed is positioned on a heat tubular member 20 which is located on a lifting mechanism 22. According to the upward and downward movements of the lifting mechanism 22, the semiconductor wafers 18 are loaded in and taken out from the reaction tube 10. When the heat tubular member 20 is lifted by means of the lifting mechanism 22 and the semiconductor wafers 18 are completely placed in the reaction tube 10, the reaction tube 10 is fully sealed.

Heating unit 27 comprising a heat generator 24, an outer cover 25 and a heat insulating member 26 is placed at the external region of the reaction tube 10. The heat generator 24 is fixed to the inner wall of the heat insulating member 26.

In this arrangement, process gas is introduced from the gas supplying unit 13 into the reaction tube 10 through the gas introducing pipe 12. The gas is heated to a predetermined temperature (1,200° C., for example) by means of the heat generator 24 and chemically reacts on the hot semiconductor wafers 18 so as to heat-treat them.

The reaction tube 10 comprises a first structural section 10a and a second structural section 10b. The first structural section 10a surrounds the semiconductor wafers 18 when they are loaded in the reaction tube 10, and is made of high thermal resisting and highly thermal conducting material such as silicon carbide (SiC). The inner face of the first structural section 10a is coated with purer SiC by means of the CVD process. The thermal resistivity is thereby increased (i.e., as discussed earlier, the SiC is not greatly distorted at high temperatures as compared with $SiO_2$). Due to the increased thermal resistivity and also to the extremely small diffusion coefficient of CVD-SiC (about $1 \times 10^{-17}$ $m^2/s$), impurities are prevented from entering the reaction tube 10. The second structural section 10b is made of quartz $SiO_2$ which is machined relatively easily.

As shown in FIG. 2, the gas introducing pipe 12 and the gas exhausting pipe 14 circumferentially separated therefrom by approximately 90° are connected to the second structural section 10b so that they pass through the reaction tube 10.

As shown in FIG. 1, the gas introducing pipe 12 comprises a fixing portion or penetrating portion 12a passing through the second structural section 10b of the reaction tube 10 and an elongated portion 12b extending upward in the reaction tube 10. These portions 12a and 12b are connected together by merely fitting the forward end of the fixing portion 12a with the elongated portion 12b. Even if small leak occurs between both portions 12a and 12b, the sealing of the reaction tube 10 is maintained, because the connecting portion is disposed in the reaction tube 10. Similarly to the reaction tube 10, the elongated portion 12b is made of SiC which has higher thermal resistivity and the fixing portion 12a is made of quartz which is machined easily.

The top end of the elongated portion 12b passes through a buffer plate 30 which is disposed horizontally slightly under the ceiling of the reaction tube 10 and has a plurality of openings 32, as shown in FIG. 3. The process gas introduced from the gas introducing pipe 12 is introduced in the space between the buffer plate 30 and the reaction tube 10. The process gas flows downward and is distributed so as to fill the reaction tube 10.

The structure of the first structural section 10a and the second structural section 10b of the reaction tube 10 will be described.

As shown in FIG. 1, a groove 34 is formed in the connecting portion of both the portions 10a and 10b. More specifically, the groove 34 has an annular shape and is formed in the connecting surface of the first section 10a and the second portion 10b. An exhausting seal pipe 36 communicates with a seal portion formed by connecting the first structural section 10a to the second structural section 10b. The exhausting seal pipe 36 extends externally and is connected to a seal exhausting unit 37. As shown in FIG. 4, the groove 34 at the seal portion communicates with a communication port 36a of the exhausting seal pipe 36.

In the heating apparatus according to this embodiment as shown in FIG. 1, the connecting portion, which connects a block member 38 on which the heat tubular member 20 is mounted to the second structural section of the reaction tube 10, is also provided with exhausting seal mechanism. More specifically, a groove 40 is formed in the lower connecting face of the second structural section 10b. The groove 40 is covered with the blocking member 38 to form a fluid passage from which an exhausting seal pipe 42 extends. Similarly to the exhausting seal pipe 36, the exhausting seal pipe 42 is connected to the seal exhausting unit 37.

As described above, the grooves 34 and 40 are formed in the connecting portions of the upper and lower portions of the second structural section 10b of the reaction tube 10, and the exhausting seal pipes 36 and 42 extend from them. The communication port 36a of the exhausting seal pipe 36 communicates with the groove 34, and the communication port 42a of the exhausting seal pipe 42 communicates with the groove 40. This exhausting seal mechanism not only allows the two parts to be closely fitted together without leaving a gap therebetween. Further, since the gas leaking to the connecting portions and the air entering from outside are exhausted together, the gas and the air can simultaneously prevented from leaking from the tube 10 and entering thereinto, respectively.

The portions shown at 50 are a fixing portion for fixing the first structural section 10a to the second structural section 10b, another fixing portion for fixing the heating unit 27 to the reaction tube 10 and two fluid passages 52 for conducting cool water. As shown in FIG. 2, the fluid passages 52 are connected to water supplying pipes 54 which are connected to a water supplying device (not shown).

With the heat treating apparatus according to this embodiment, the first structural portion 10a is surrounded by the heating unit 27, i.e., the section in which the semiconductor wafers 18 (which are articles to be treated) are loaded is made of SiC. As the heating unit 27 is operated, the temperature of the structural section 10a is rapidly raised to a high level because the section 10a has high thermal conductivity, and the entire first structural section 10a is heated uniformly. In this way, the semiconductor wafers 18 are heated substantially uniformly, whereby uniform heat treatment can be carried out. Since SiC is less deformed at a high temperature, the reaction tube 10 is hindered from being deformed. When impurities approach the reaction tube 10 from the outside thereof, they are prevented from entering the reaction tube 10 since the CVD-SiC has an extremely small diffusion coefficient.

The provision of gas introducing pipe 12 and the gas exhausting pipe 14 as well as the exhausting seal pipes 36 and 42 makes the second structural section 10b complicated. However, the second structural section 10b is made of quartz and thus it is machined easily. Since quartz has lower thermal conductivity than SiC, heat radiation from the lower opening of the reaction tube 10 is reduced, and thus the temperature of the wafer receiving portion can be controlled easily so as to be rendered uniform.

The first structural section 10a and the second structural section 10b are connected together so that the lower end of the first structural section 10a is closely fitted to the upper end of the second structural section 10b without leaving a gap therebetween by evacuating the groove 34 formed in the connecting portion for connecting both the structural sections 10a and 10b together through the exhausting seal pipe 36 and the complete sealing between these sections is ensured. Although the reaction tube 10 comprises two sections, this structure does not lower the sealing, and more advantageously, sealing higher than that of the conventional reaction tube can be effected.

Figure 5:
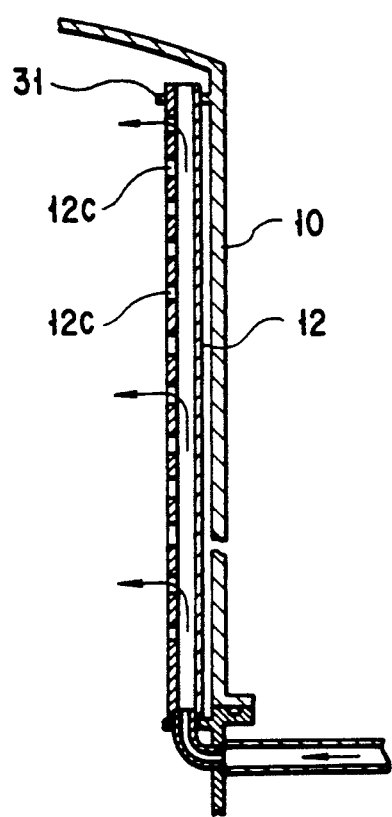
FIG. 5 is a longitudinal cross sectional view of a modification of the gas introducing pipe of the heat treating apparatus according to this invention.

Since the gas introducing pipe 12 is made up of two parts, the elongated portion 12b in the gas reaction tube 10 is readily removed upon washing it. After removing the elongated portion 12b, reacting chemical substance attached to the reaction tube 10 can be removed easily. The elongated portion 12b can be removed and replaced with a new one or one of another type. For example, in place of the gas introducing pipe 12 which does not have any openings at its intermediate portion and has the upper end passing through the buffer plate 30 of the embodiment shown in FIG. 1, a gas introducing pipe 12 provided at its intermediate portion with a plurality of gas supplying openings 12c as shown in FIG. 5 can be used. In the modification as shown in FIG. 5, process gas can be uniformly distributed in the reaction tube without using the buffer plate 30 of the embodiment shown in FIG. 1. The forward end of the gas introducing pipe 12 is held by a supporting portion 31. It is preferred that the lower portion of the elongated portion 12b be formed to receive the forward end of the fixing portion 12a so that it is applicable to various cases.

This invention is not limited to the vertical heat treating apparatus but is also applicable to a horizontal heat treating apparatus.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A heat treating apparatus comprising:
a reaction tube for receiving a plurality of articles to be treated; and
means for heating the inside of said reaction tube,
said reaction tube comprising a first cylindrical section which has a closed end and an open end, and at least part of an outer peripheral surface of which is surrounded by said heating means, and a second cylindrical section which has an open end in contact with the open end of the first cylindrical section, and at least part of which extends from said heating means, said first cylindrical section being made of material having thermal resistivity and thermal conductivity higher than said second cylindrical section.

2. The apparatus according to claim 1, further comprising exhausting seal means for reducing a pressure on a portion between the open ends of the first and second cylindrical sections for sealingly connecting said first cylindrical section to said second cylindrical section by a negative pressure and for exhausting gas which enters the portion between the open ends, externally of said reaction tube.

3. The apparatus according to claim 2, wherein said exhausting seal means comprises an annual space formed in at least one of the open ends, and an exhausting pipe communicating with said annular space.

4. The apparatus according to claim 1, wherein said first cylindrical section is made of silicon carbide and said second cylindrical section is made of quartz ($SiO_2$).

5. The apparatus according to claim 4, wherein said first cylindrical section has an inner face coated with SiC.

6. The apparatus according to claim 1, wherein said second cylindrical section has another open end, and which further comprises a blocking member for opening and closing said another open end of said second cylindrical section.

7. The apparatus according to claim 6, further comprising second exhaust seal means for reducing a pressure on a portion between the another open end and said blocking member and for exhausting gas, which enters said portion between the another open end and said blocking member, externally of said reaction tube, said second exhausting seal means comprising an annular space formed in at least one of another open end and the blocking member, and a second exhausting pipe.

8. The apparatus according to claim 1, further comprising gas introducing means for supplying process gas into said reaction tube, said gas introducing means comprising a penetrating portion having a forward end portion passing through the second cylindrical section and extending into said reaction tube, and an elongated portion detachably connected to said forward portion of said penetrating portion and extending to the first cylindrical section.

9. The apparatus according to claim 8, wherein said penetrating portion of said gas introducing means is made of quartz ($SiO_2$), and said elongated portion is made of silicon carbide (SiC).

10. The apparatus according to claim 8, wherein said elongated portion of said gas introducing means has a plurality of gas introducing openings arranged lengthwise of said elongated portion.

11. A heat treating apparatus comprising:
a vertical reaction tube for receiving a plurality of articles to be treated;
heating means for heating the inside of said reaction tube; and
gas introducing means for supplying process gas into said reaction tube, said gas introducing means comprising a penetration tube portion having a forward end portion passing through a lower portion of said reaction tube and projecting in said reaction tube, and an elongated tube portion detachably connected to said portion of said penetrating portion and extending to an upper portion of said reaction tube, said forward end portion being made of material having thermal resistivity and thermal conductivity higher than said penetrating portion.

12. The apparatus according to claim 11, wherein said penetrating tube portion is made of quartz ($SiO_2$) and said elongated tube portion is made of silicon carbide (SiC).

13. The apparatus according to claim 11, wherein said elongated tube portion of said gas introducing means has a plurality of gas introducing openings arranged lengthwise of said elongated portion.

14. The apparatus according to claim 11, wherein said reaction tube comprises a first tubular section, at least part of which is surrounded by said heating means, and a second tubular section which is connected to the first tubular section and at least part of which downwardly projects from said heating means, said first tubular section being made of material having thermal resistivity and thermal conductivity higher than said second tubular section.

15. The apparatus according to claim 14, further comprising exhausting seal means for reducing a pressure on a connecting portion for connecting said first tubular section to said second tubular section and for exhausting gas, which enters said connecting portion, externally of said reaction tube.

16. The apparatus according to claim 15, wherein said exhausting seal means comprises an annular space formed in said connecting portion and an exhausting pipe communicating with said annular space.

17. The apparatus according to claim 11, wherein said first tubular section is made of silicon carbide (SiC) and said second tubular section is made of quartz ($SiO_2$).

18. The apparatus according to claim 17, wherein said first tubular section has an inner face coated with SiC.

19. The apparatus according to claim 11, wherein said second tubular section has a lower opening, and which further comprises a blocking member for opening and closing said lower opening of said second tubular section.

20. The apparatus according to claim 19, further comprising second exhausting seal means for reducing a pressure on a portion between said second tubular section and said blocking member for sealing it and for exhausting gas, which enters said portion between said second tubular section and said blocking member, externally of said reaction tube, said second exhausting seal means including an annular space formed in at least one of said second tubular section and the blocking member, and a second exhausting pipe communicating with said annular space.

21. A heat treating apparatus comprising:
a vertical reaction tube for receiving a plurality of articles to be heated;
means for supplying gas into the reaction tube;
means for heating the inside of the reaction tube;
said reaction tube including an upper tube section having a peripheral wall with a circular bottom end face, and a closed top end, and lower tube section having a peripheral wall with a circular upper end face, the circular bottom end face of the upper tube section being situated on and in contact with the circular upper end face of the lower tube section, and at least one of the circular bottom end face of the upper tube section and the circular upper end face having an annular groove formed therein; and
means for reducing a pressure in the annular groove thereby connecting the upper tube section and the lower tube section with an air-tight sealing therebetween and exhausting air which enters between the upper and lower tube sections.

22. The apparatus according to claim 21, wherein said upper and lower tube sections are made of different materials.

23. The apparatus according to claim 21, wherein a peripheral wall of said lower tube section has a circular lower face for defining an opening surrounded thereby, and which further includes:
a blocking member for selectively closing and opening the opening of the circular lower face of said lower tube section, the blocking member having an upper surface which is brought into contact with the circular lower face of the lower tube section when it is closed, and at least one of the circular bottom face of the lower tube section and the upper surface of the blocking member having another annular groove formed therein; and
means for reducing a pressure in said another annular groove thereby sealing the lower tube section and the blocking member and exhausting air which enters a region between the lower tube section and the blocking member.

24. The apparatus according to claim 11, wherein the forward end portion of said penetrating tube portion has a slightly smaller outer diameter then an inner diameter of a lower part of the elongated tubular portion so that the forward end portion of said penetrating tube portion is inserted into the lower part of the elongated tubular portion to detachably support the elongated tubular portion.

* * * * *